United States Patent
Jahns et al.

(10) Patent No.: US 9,383,417 B2
(45) Date of Patent: Jul. 5, 2016

(54) METHOD FOR MEASURING A MAGNETIC FIELD USING MAGNETOELECTRIC SENSORS

(75) Inventors: Robert Jahns, Kiel (DE); Reinhard Knoechel, Elmshorn (DE); Eckhard Quandt, Heikendorf (DE)

(73) Assignee: Christian-Albrechts-Universitaet zu Kiel, Kiel (DE)

( * ) Notice: Subject to any disclaimer, the term of this patent is extended or adjusted under 35 U.S.C. 154(b) by 467 days.

(21) Appl. No.: 13/992,474

(22) PCT Filed: Jan. 13, 2012

(86) PCT No.: PCT/DE2012/000029
§ 371 (c)(1),
(2), (4) Date: Jun. 7, 2013

(87) PCT Pub. No.: WO2012/097796
PCT Pub. Date: Jul. 26, 2012

(65) Prior Publication Data
US 2013/0289913 A1    Oct. 31, 2013

(30) Foreign Application Priority Data

Jan. 18, 2011  (DE) .................. 10 2011 008 866

(51) Int. Cl.
*G01R 33/02* (2006.01)
*G01R 33/06* (2006.01)
*G01R 33/18* (2006.01)

(52) U.S. Cl.
CPC ............... *G01R 33/02* (2013.01); *G01R 33/06* (2013.01); *G01R 33/18* (2013.01)

(58) Field of Classification Search
CPC ......... G01R 33/02; G01R 33/06; G01R 33/18
USPC .......... 702/38, 65, 75, 76, 106, 115; 324/244, 324/249; 455/41.1
See application file for complete search history.

(56) References Cited

U.S. PATENT DOCUMENTS 7,023,206 B2    4/2006  Viehland et al.
7,129,691 B2 *  10/2006 Shibahara ............ G01R 15/202
                                                   324/117 H (Continued)

OTHER PUBLICATIONS

Edelstein, Alan S et al. "Approach for sub pT, room temperature magnetic sensors" Sensors, 2010 IEEE, IEEE, Piscataway, NJ, USA Nov. 1, 2010, pp. 620-622, XP031977848 DOI: 10.1109/ICSENS.2010.5690118, ISBN: 978-1-4244-8170-5.

(Continued)

*Primary Examiner* — John H Le
(74) *Attorney, Agent, or Firm* — Patent Central LLC; Stephan A. Pendorf

(57) ABSTRACT

A method for measuring a time-variant magnetic field using a magnetoelectric sensor having mechanical resonant frequency $f_R$, wherein the magnetic field has at least one component having harmonic time dependence with the measuring signal amplitude to be determined $H_{mess0}$ and the measuring signal frequency to be determined $f_{mess}$ in a known frequency interval $f_{min} < f_{mess} < f_{max}$. The method includes: a. superimposing the magnetic field with a modulation magnetic field having harmonic time dependence with the known modulation amplitude $H_{mess0}$ and a selectable modulation frequency on the sensor, b. varying (wobbling) the modulation frequency over a complementary frequency interval determined by the known interval limits $f_{min}$, $f_{max}$ and the resonant frequency of the sensor, c. measuring the sensor signal for each selected modulation frequency, d. searching for the at least one modulation frequency $f_{mod}$, which results in a sensor signal in the mechanical resonance of the sensor, e. calculating the measuring signal frequency $f_{mess}$ from the previously determined modulation frequency $f_{mod}$ and from the resonant frequency of the sensor $f_R$, f. transmitting the sensor signal at the modulation frequency $f_{mod}$ into the superimposed magnetic field amplitude $H_{sup}$, and g. calculating the measuring signal amplitude $H_{mess0}$ from the superimposed magnetic field $H_{sup}$ and the modulation amplitude $H_{mod0}$.

7 Claims, 8 Drawing Sheets

(56) References Cited

U.S. PATENT DOCUMENTS 8,222,898 B1 7/2012 Edelstein
2010/0015918 A1 1/2010 Liu et al.

OTHER PUBLICATIONS

Greve, Henry et al. "Giant mangnetoelectric coefficients in (Fe90Co10)78Si12B10-AlN thin film composites" Applied Physics Letters, AIP, American Institute of Physics, Melville, NY, USA, vol. 96, No. 18, May 3, 2010, pp. 182501-182501, XP012131006, ISSN: 0003-6951, DOI: 10.1063/1,3377908, the whole document.

Gillette, S. M. et al. "Improved Sensitivity and Noise in Magneto-Electric Magnetic Field Sensors by Use of Modulated AC Magnetostriction" IEEE Magnetics Letters, vol. 2 (2011), USA.

* cited by examiner

METHOD FOR MEASURING A MAGNETIC FIELD USING MAGNETOELECTRIC SENSORS

BACKGROUND OF THE INVENTION

1. Field of the Invention

The invention relates to a method for measuring time-variant magnetic fields using magnetoelectric sensors.

2. Description of the Related Art

Magnetoelectric sensors, also referred to as ME sensors, are among others suitable for detecting small time-variant magnetic fields that are caused for example by currents in biological organisms. They are regarded as promising candidates for replacing so-called SQUIDS that are based on superconductivity and for this purpose require constant and extreme cooling. ME sensors are the subject matter of current research among others with respect to the development of biomagnetic interfaces that might be used at first in medical diagnostics, e.g. MEG, MCG, and in future possibly also on prosthesis control or even for the general 'thought control' of computers and machines.

The basic concept of the functioning of all ME sensors is the mechanical force coupling of magnetostrictive and piezoelectric materials.

Magnetostrictive materials, e.g. ferromagnetic transition metals, Fe, Ni, Co, and their alloys, compounds of rare earths Tb, Dy, Sm with the ferromagnetic transition metals, e.g. TbFe2, SmFe2, or also ferromagnetic glasses that predominantly contain the elements iron, cobalt, boron or silicon in varying quantities, experience a reversible change in length in the direction of a magnetic field that acts on them. This change in length is attributed to the orientation of elementary magnets along the external magnetic fields and according to present knowledge can amount to up to 2.5 mm/m=2500 ppm at room temperature.

If a magnetostrictive material is now coupled mechanically firmly to a piezoelectric, e.g. lead zirconate titanate (PZT), polyvinylidene fluoride (PVDF), aluminum nitride (AlN), the magnetostrictive expansion can exert a force that leads to a structural charge transfer, polarization, in the piezoelectric, that again leads to a measurable piezo voltage. This voltage can be detected electronically as a measure for the magnetic field strength and evaluated.

There is a diversity of ME sensors of different designs. Among the most simple is a multi-layer film system comprising at least one layer from a magnetostrictive material directly having arranged thereon a piezoelectric layer and a metallization layer as electrode on the piezo material. Conventionally, the film system is in the shape of a strip that is attached at at least one end. With a magnetic field acting along the strip length, the strip bends due to the different expansion of the material, and the piezo material which is thus simultaneously bent is polarized electrically. The electric potential difference between the two flat strip sides can be tapped as the measurement voltage.

Magnetostrictive, also referred as to ME, and piezoelectric, also referred as to PE, material films can be deposited on top of each other and/or on predetermined substrates using coating methods that are known per se. The manufacture of ME sensors is to this extent compatible with processes of the silicon technology; in particular integrated ME sensors can be manufactured for example in MEMS style, Micro Electrical Mechanical Systems. However, the separate production of MS and PE foils and subsequently gluing both together to form an ME foil is suited for producing magnetic field sensors according to the principle described, too.

All ME sensors are mechanical oscillators. When a periodic magnetic field of defined frequency acts on them, they exhibit a forced mechanical oscillation behavior. If in the process the excitation takes place at the mechanical resonant frequency of the ME sensor, even very small magnetic field strengths result in very great measurement voltages.

Biologically produced magnetic fields typically only have frequencies of the order of magnitude of 1 Hz up to approximately 100 Hz. In contrast, the resonant frequencies of common ME sensors amount to some 100 Hz up to a few 100 kHz. It can be expected that a further miniaturization of the ME sensors, for example by integration into MEMS, may further lead to even higher resonant frequencies.

The ratio between the ME electric field-strength amplitude caused in the ME sensor and the exciting magnetic field-strength amplitude is referred to as ME coefficient $\alpha_{ME}$. The ME coefficient typically varies by two to three orders of magnitude between measurements of magnetic fields in the resonant case and far outside the resonance.

It would therefore be desirable to be able to have at one's disposable in each case ME sensors having a suitable resonant frequency, in order to detect small magnetic fields of a frequency known in advance. In fact there are efforts to tune for example ME sensors of the strip style described initially to lower resonant frequencies by arranging additional masses. However, the ME coefficient even then exhibits a sharply limited maximum at the resonant frequency so that adjacent frequencies provide markedly weaker signals. Even an array of ME sensors that all exhibit different resonant frequencies, e.g. proposed in US 2010/0015918 A1, the ME sensors being intended as receivers of magnetic carrier waves and the array realizing a multiplicity of data channels, does not necessarily lead to a sufficiently dense scanning of a frequency band on which an a priori unknown signal is to be detected. Over and above this, an array having hundreds of ME sensors could in practice only be manufactured as an integrated microsystem, and reducing the mechanical resonant frequencies of kHz oscillators to the biomagnetic band range, 100 Hz, can hardly be carried out in the process.

Alan S. Edelstein, et al. "Approach for sub pT, Room Temperature Magnetic Sensors" Sensors, 2010 IEEE, IEEE, Piscataway, N.J., USA dated 1 Nov. 2010, pages 620-622, discloses a method for measuring a time-variant magnetic field using a magnetoelectric sensor, where the magnetic field—in the paper a test field having a frequency of 10 Hz is used—is modulated using a rotating disk that acts as a 'magnetic flux concentrator', to suppress the 1/f noise. Modulation takes place at the rotational frequency of the disk, 76 Hz, and causes a frequency conversion of the magnetic field, and thus of the ME sensor signal, to 66 and 86 Hz. Edelstein et al. also propose to carry out the frequency conversion up to and into the mechanical resonant frequency of the ME sensor. Since, however, this is positioned between 200 and 300 kHz according to FIG. 2 shown there, use of a rotating disk as magnetic flux concentrator in principle does not seem to be suitable for this purpose.

Greve, Henry et al. "Giant magnetoelectric coefficients in (Fe90Co10)78Si12B10-AlN thin film composites", Applied Physics Letters, AIP, American Institute of Physics, Melville, N.Y., USA, dated 3 May 2010, pages 182501-182501, further discloses a thin film magnetoelectric composite, using which it seems possible to realize a 3-dimensional vector field sensor since a sensor element having a preferred sensitivity only in one dimension could be manufactured.

ME sensors are usually also operated outside their mechanical resonance. Since an interest exists in the greatest possible measurement dynamics, the greatest possible signal noise ratio, and the linearity of the voltage response to the alternating magnetic field that is to be measured, an operating point for the ME sensor is selected in the linear domain of the magnetostriction characteristic, see FIG. 1. This characteristic $\lambda$ (H) describes the length expansion $\lambda$ of the MS material under the influence of a magnetic field H and its course is always symmetrical since both field directions have the same effect on the material. Without a field, the function $\lambda$ (H) initially has a parabolic rise, but at the same time has an upper limit, on reaching the saturation magnetization. Consequently, it exhibits an inflection point $H_B$ where the linear term of the Taylor expansion of $\lambda$ dominates around $H=H_B$ and where at the same time the greatest gradient occurs. To operate the ME sensor in this favorable working point, preferably a constant magnetic bias field having the strength $H_B$ is applied by suitably arranging current conductors or permanent magnets.

However, such a magnetic bias field is not without problems when applied in practice. Especially in the case of several ME sensors in a very close neighborhood relative to each other, mutual influences of the magnetic bias fields can occur, in particular if the fields are generated according to the Biot-Savart Law and the currents have to be conducted via leads. In terms of energy, permanent-magnetic bias fields are more favorable, but simply require a sufficient amount of magnetic material to be arranged so as to obtain suitable field strengths. Great effort is therefore placed on developing film systems and laminates from magnetostrictive and piezoelectric materials for ME sensors that can be brought into the operating point using the smallest possible magnetic bias field strengths. Such film systems are described for example in the paper by Zhai et al. "Giant magnetoelectric effect in Metglas/polyvinylidene-fluoride laminates", APPLIED PHYSICS LETTERS 89, 083507 (2006) and in U.S. Pat. No. 7,023,206 B2. Nevertheless, a bias field of several Oersted, obsolete cgs unit for the magnetic field strength: 1 Tesla=$\mu 0 \times 10{,}000$ Oersted, is still required.

BRIEF SUMMARY OF THE INVENTION

It would be desirable to be able to completely dispense with constant bias fields, in particular also not having to make any provisions for setting them up appropriately during the ME sensor production or during the measurement operation.

The invention poses the object of proposing a method for measuring magnetic fields using any ME sensor via freely selectable, in particular biomagnetic, frequency bands having a very high frequency-independent sensor sensitively. The object is achieved by a method having the features of the main claim. The sub claims specify advantageous embodiments of the method. An independent claim relates to measuring a magnetic field using an array of ME sensors.

The inventive method uses the mechanical resonance of the ME sensor and the square course of the magnetostriction characteristic $\lambda$ (H)$\approx$a $H^2+O(H^4)$ in the surrounding of $H=0$, that is when no magnetic bias field is present. In the process, the proportionality constant a is known for each given ME sensor or can also be measured directly.

According to the invention, there is superimposed on any signal to be measured having a harmonic dependence on the time t $$H_{mess}(t)=H_{mess0}\times\cos(2\pi f_{mess}t) \quad (1)$$

an additionally generated harmonic modulation signal $$H_{mod}(t)=H_{mod0}\times\cos(2\pi f_{mod}t) \quad (2)$$

on the ME sensor. Here, the amplitude $H_{mod0}$ and the frequency $f_{mod}$ of the modulation signal are entirely in the user's hand. The modulation signal is generated by a frequency generator and preferably irradiated onto the ME sensor as an electromagnetic wave by means of an antenna. As an alternative, the modulation magnetic field can also be generated by a coil around the ME sensor. The unknown quantities $H_{mess0}$ and $f_{mess}$ are to be determined as the amplitude and frequency of the measuring signal.

The ME sensor "sees" the summation signal $H_{mess}$ (t)+ $H_{mod}(t)$ as a result of the change in length of the magnetostrictive material in the form of $$\lambda(t) \approx a(H_{mess}(t))^2 + a(H_{mod}(t))^2 + 2a\, H_{mess}(t) + H_{mod}(t) + O(H^4) \quad (3)$$

The third term of Equation (3) is the leading intermodulation term, this being the decisive factor.

$$2aH_{mess}(t) \times H_{mod}(t) = \quad (4)$$
$$aH_{mess0} \times H_{mod0}[\cos(2\pi(f_{mess}+f_{mod})t) + \cos(2\pi(f_{mess}-f_{mod})t)]$$

The user can thus set $f_{mod}$ in such a manner that $f_{mess}+f_{mod}$ or $f_{mess}-f_{mod}$ precisely corresponds to the resonant frequency of the ME sensor. If a specific frequency band of the measuring signal is to be detected, $f_{mod}$ is varied, or also: wobbled, in a correspondingly complementary frequency band.

It can always be assumed that the resonant frequency $f_R$ of an ME sensor is known. If in doubt, a simple preliminary experiment—in particular irradiating and wobbling the modulation signal in the absence of a measuring signal across the frequency range of interest—the position of the resonant frequency can be determined quickly.

If a measuring signal in the frequency band $f_{min} \leq f_{mess} \leq f_{max}$ is to be detected, the modulation signal is to be varied across one of the two complementary frequency ranges $$f_R-f_{max} \leq f_{mod} \leq f_R-f_{min} \quad (5)$$

or $$f_R+f_{min} \leq f_{mod} \leq f_R+f_{min} \quad (6),$$

as a result of which the ME sensor is always excited to resonate. By mixing with the modulation signal, there is a frequency conversion of the measuring signal into the sensor resonant frequency.

The voltage signal across the sensor output is solely determined by the intermodulation term having the amplitude $H_{mess0} \times H_{mod0}$, the remaining terms in Equation (3) typically exhibiting frequencies that are clearly outside the resonant frequency of the sensor and whose contributions to the voltage can therefore be neglected. The voltage amplitude that can be measured can be directly translated into the amplitude of the magnetic field, and division by the known value $H_{mod0}$ results in the looked-for value $H_{mess0}$.

It is to be empathized here in particular that the inventive method functions without any magnetic bias field. Moreover, it functions best at $H=0$, where the square contribution of the magnetostriction characteristic dominates.

The amplitude $H_{mod0}$ of the modulation signal is a parameter that can be freely selected by the user, using which, however, he can still increase the measurement dynamics. The output voltage of the ME sensor rises linearly with the modulation amplitude, however, only up to a value of approximately $H_{mod0}=H_B$. As has already been mentioned in the discussion of the prior art, the field strength $H_B$ is characterized precisely by the inflection point of the magnetostriction characteristic $\lambda$ (H). It indicates the strength of the magnetic bias field that would have to be applied to measure, using the given ME sensor, outside its resonance in the optimum operating point.

It is therefore a preferred embodiment of the invention, to set the modulation signal with an amplitude that corresponds to the magnetic bias field strength of the ME sensor during operation according to the prior art. Since the modulation signal can be irradiated onto the sensor, still favorably no measures in terms of apparatus have to be carried out at the sensor itself or even during its manufacture.

BRIEF DESCRIPTION OF THE SEVERAL VIEWS OF THE DRAWINGS

The invention is to be explained below in more detail using an exemplary embodiment and some figures. In the drawings.

DETAILED DESCRIPTION OF THE INVENTION

An ME sensor having a strip design with an area of 20×2 mm$^2$ that is firmly clamped in at one end of the strip, is used for the exemplary embodiment. The lowest film of the sensor consists of a 130 μm thick silicon carrier on which a 300 nm thick molybdenum foil is arranged. The film on top of it consists of 1800 nm thick piezoelectric aluminum nitride. On top of this, a 1750 nm thick magnetostrictive film of metallic glass, FeCoSiB, is situated. The ME voltage is tapped between the molybdenum film and the magnetostrictive film and measured using a lock-in amplifier or a spectral analyzer. The modulation field is generated using an air coil around the sensor and the measuring signal using a Helmholtz pair of coils.

Figure 1:
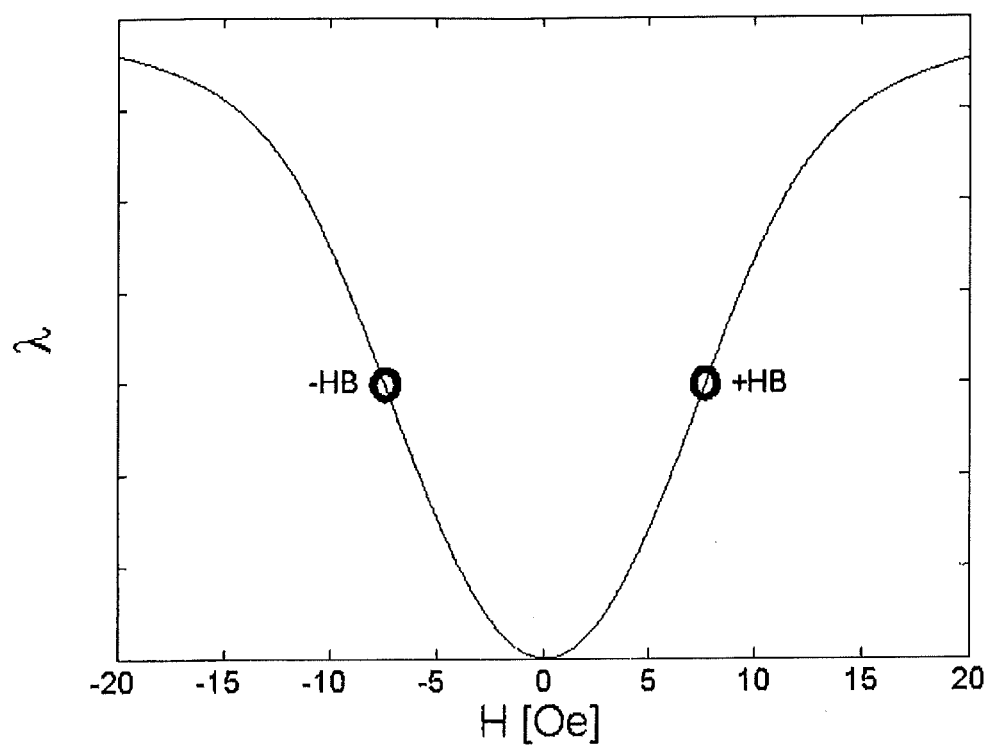
FIG. 1 shows the qualitative course of the magnetostriction characteristic $\lambda$ (H)
Figure 3:
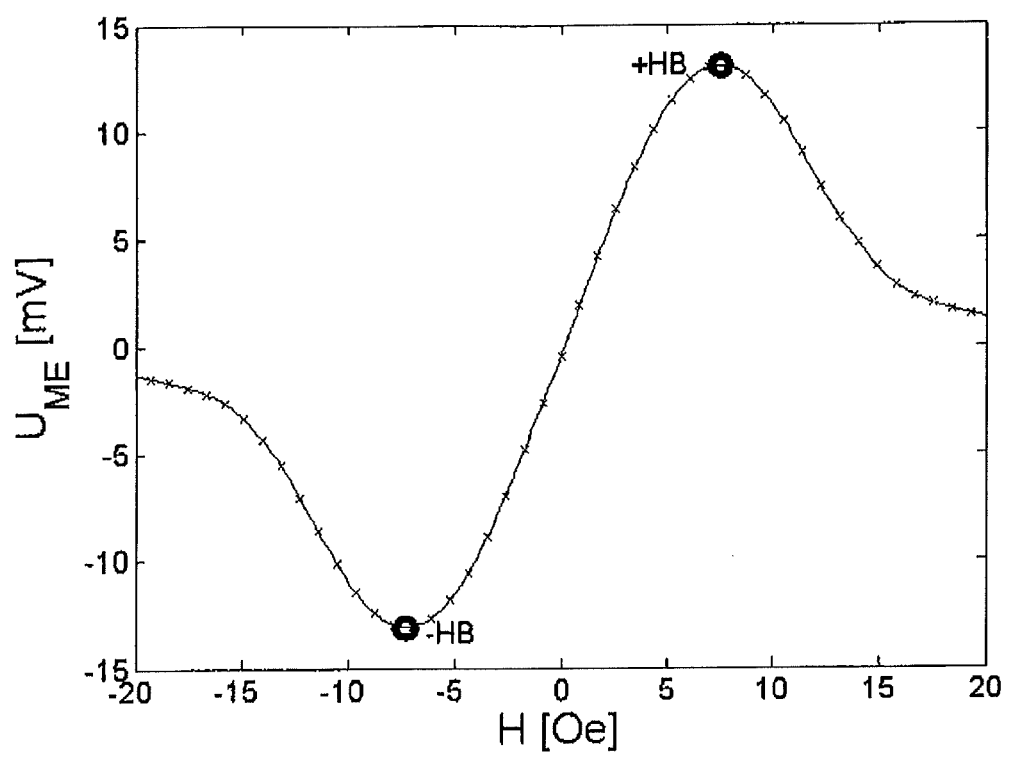
FIG. 3 shows the result of a preliminary examination for determining the optimum operating point or the magnetic bias field for the sensor of the exemplary embodiment.

The magnetostriction characteristic $\lambda$ (H) of the exemplary sensor runs qualitatively as illustrated in FIG. 1. It is easy to recognize the parabolic shape in the absence of a magnetic field, no bias, H=0, and the two inflection points at H=±H$_B$. The curve in FIG. 1 can be calculated as the primitive of the measurement curve in FIG. 3.

Figure 2:
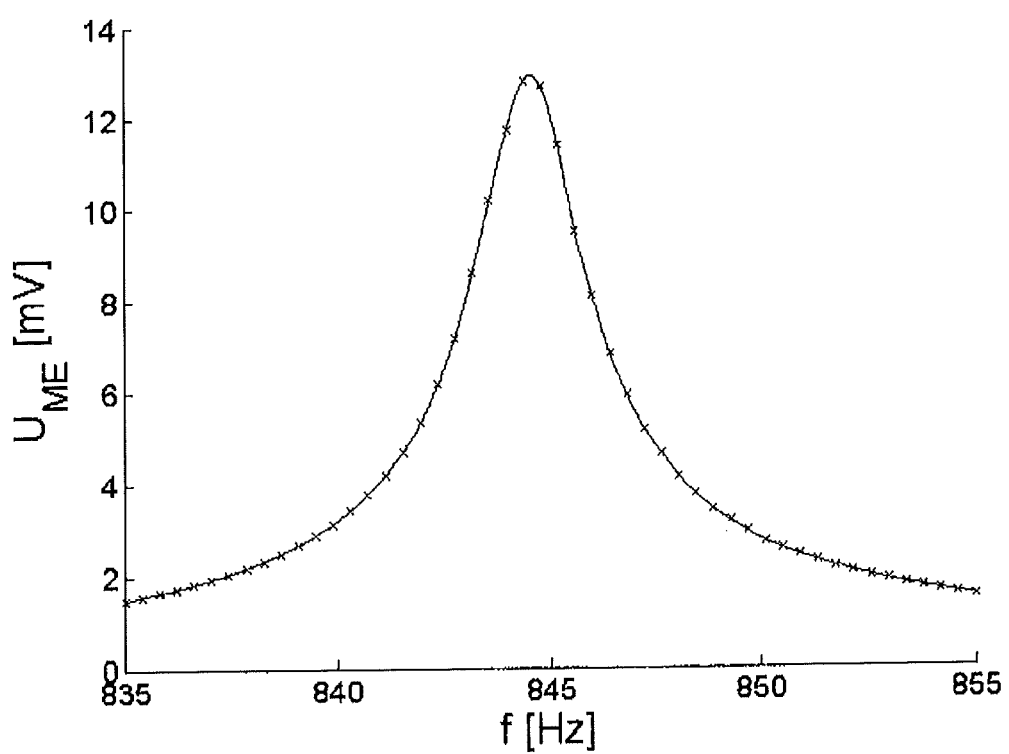
FIG. 2 shows the course determined for the sensor of the exemplary embodiment, of its mechanical resonance curve.

To determine the mechanical resonance of the ME sensor, the frequency of a measuring signal is varied across a frequency range in which the resonant frequency must lie. Here the magnetic field strength amounts to $H_{mess0}$=0.125 Oe. The ME voltage shows a sharp maximum at $f_R$=844 Hz, as shown in FIG. 2. From this follows for the conventional ME coefficient in the resonant case $$\alpha_{ME} = \frac{U_{ME}}{L \cdot H_{AC}} = \frac{12.9 \text{ mV}}{1.8 \cdot 10^{-4} \text{ cm} \cdot 12.5 \cdot 10^{-6} \cdot 10^4 \text{ Oe}} = 577.33 \frac{V}{\text{cm Oe}}, \quad (7)$$

where the electric field strength corresponds to that in a plate capacitor having a plate separation L, thickness of the piezoelectric film of the sensor=1.8 μm.

While the ME sensor is excited to resonate mechanically by the measuring signal with $H_{mess0}$=0.125 Oe and $f_{mess}$=844 Hz, a magnetic bias field can be applied along the magnetostrictive film of the sensor and varied to determine the optimum operating point according to the prior art. As can be gathered from FIG. 3, the highest sensor voltage $U_{ME}$ can be obtained at a field strength $H_B$=±7.36 Oe.

Figure 4:
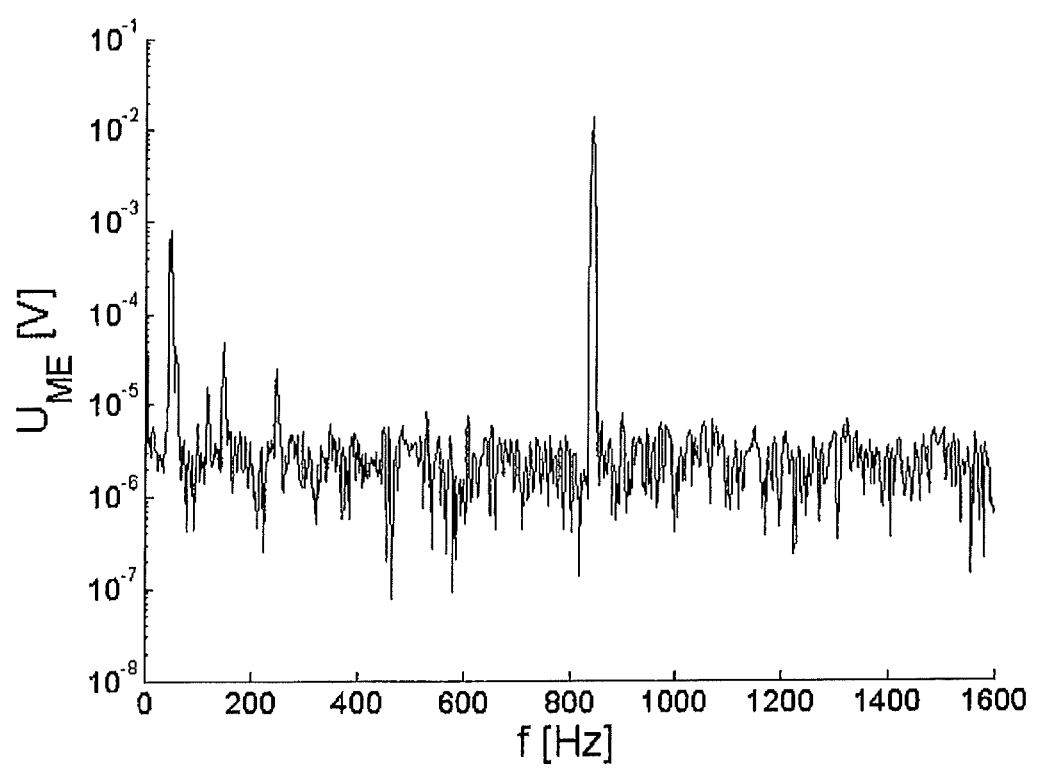
FIG. 4 shows the result of a frequency analysis of the sensor signal, ME voltage $U_{ME}$, if the frequency of the measuring signal $f_{mess}$ corresponds to the resonant frequency of the sensor.
Figure 5:
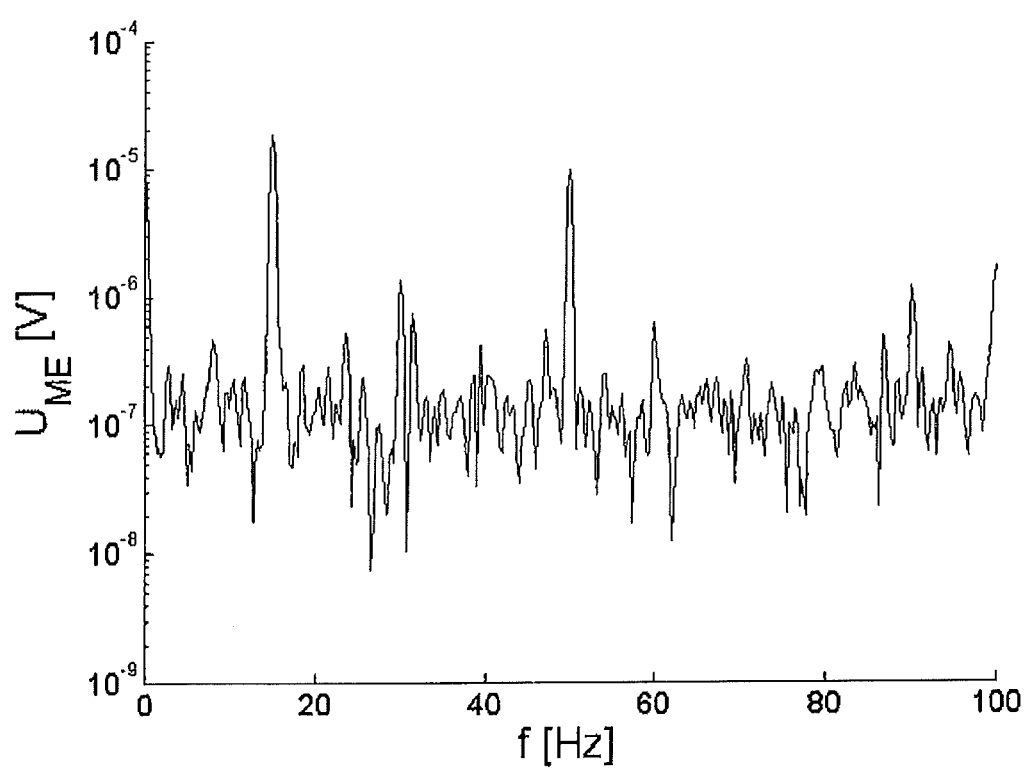
FIG. 5 is like FIG. 4, however, the frequency of the magnetic field to be measured is $f_{mess}$=15 Hz.
Figure 6:
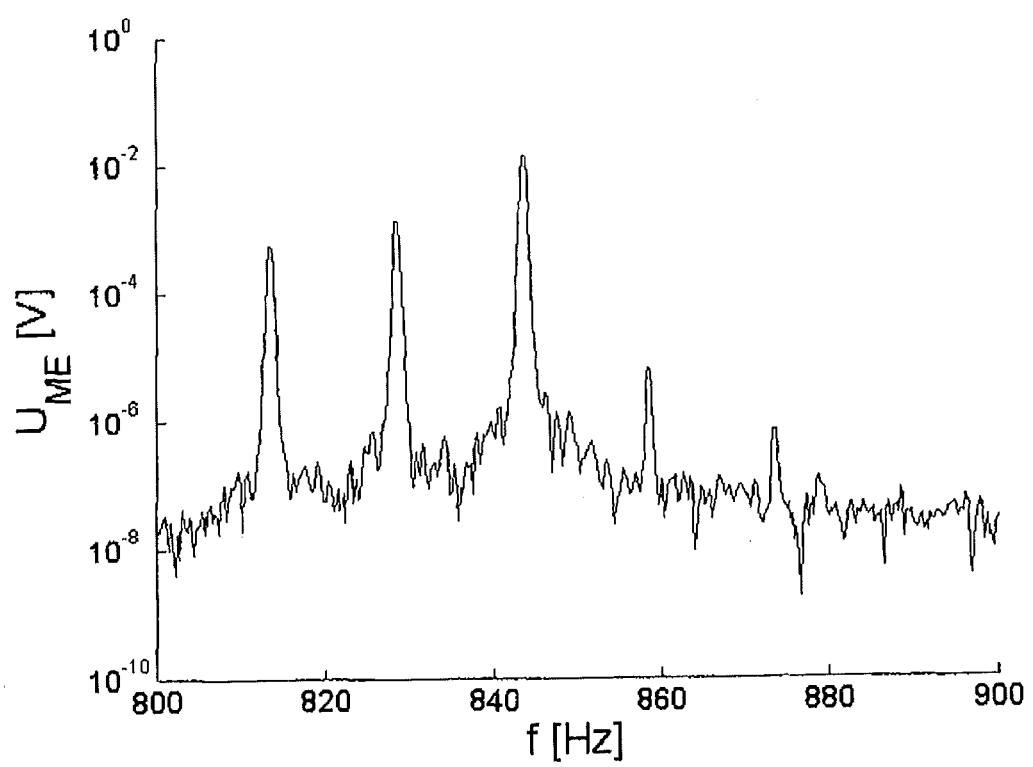
FIG. 6 shows the result of the measurement of the signal from FIG. 5 (15 Hz) using the inventive method and without a magnetic bias field.
Figure 7:
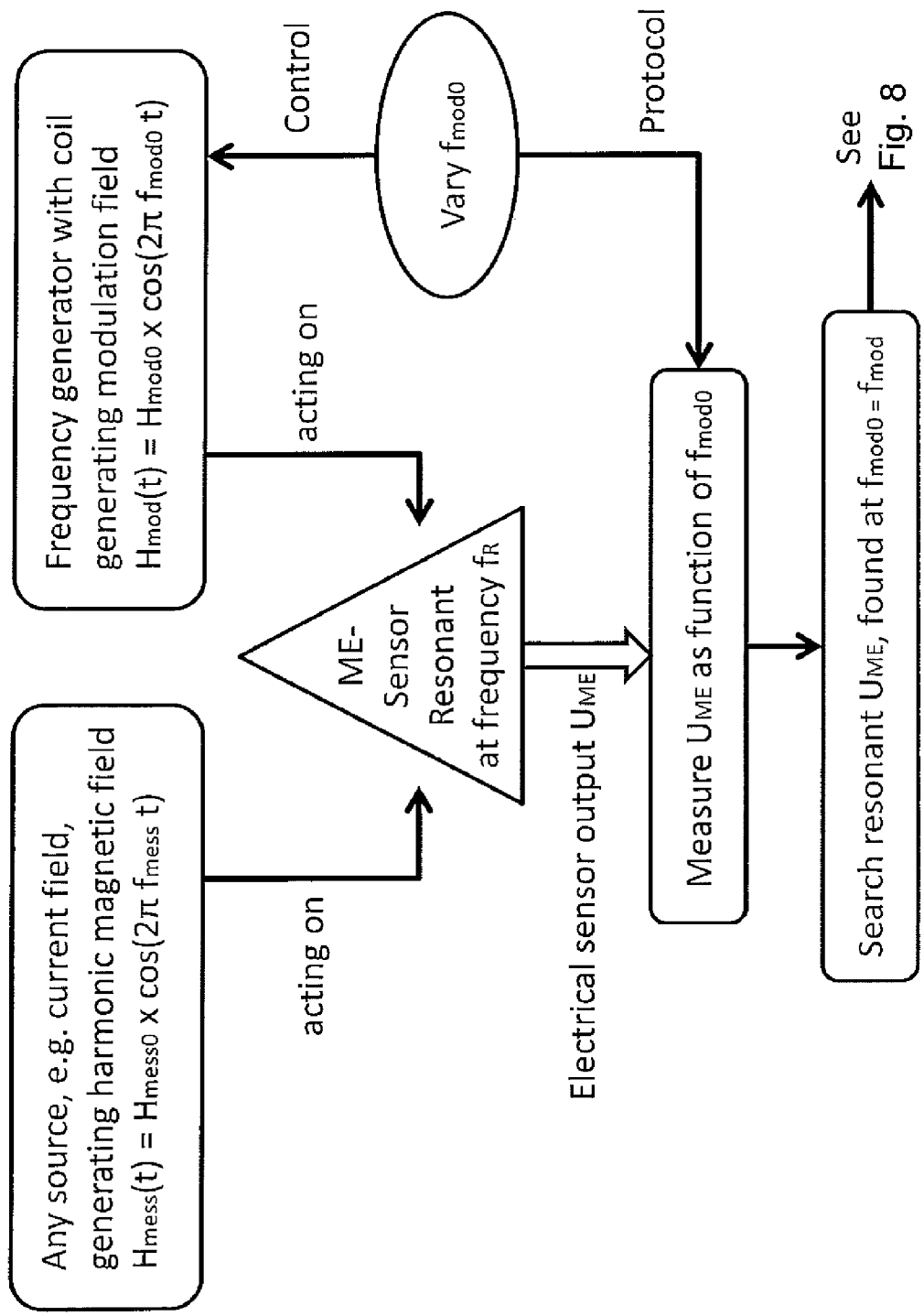
FIGS. 7-8 represent a schematic flowchart of claimed process steps.
Figure 8:
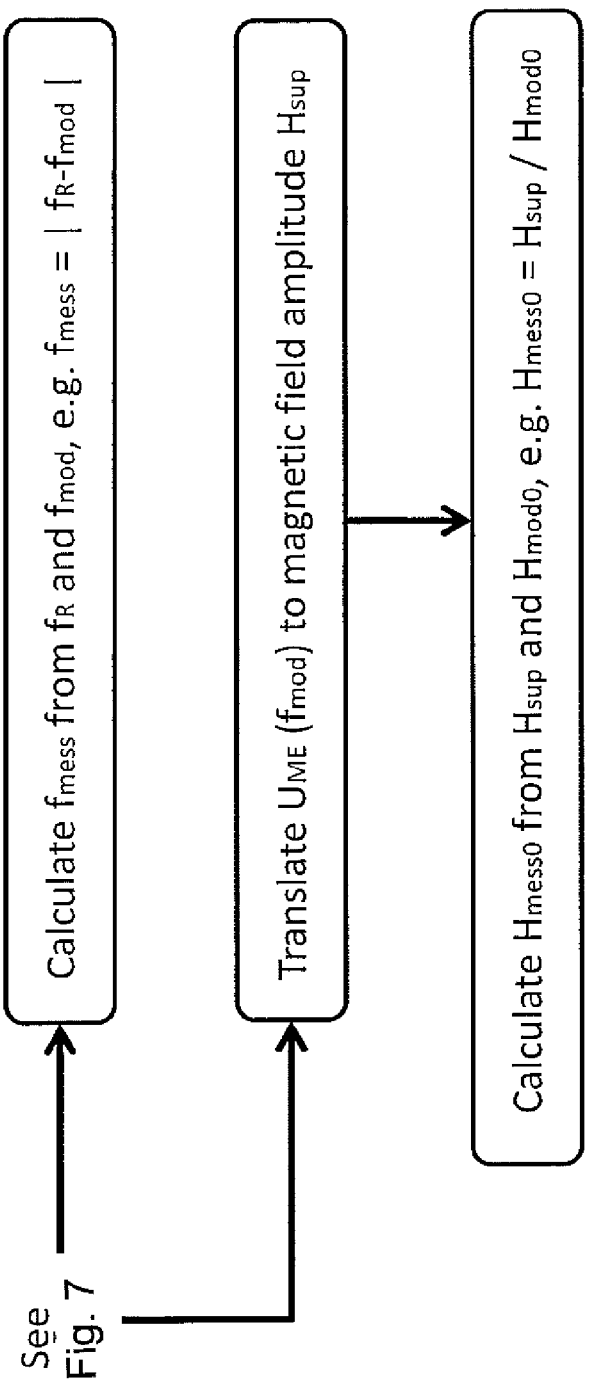

FIGS. 4 to 6 in each case show the measured sensor voltage $U_{ME}$ split up according to frequencies using a spectral analyzer. Please note the logarithmic subdivision of the ordinate. FIG. 4 shows the frequency components of the ME voltage for the measuring signal with $H_{mess0}$=0.125 Oe and $f_{mess}$=844 Hz when simultaneously applying a constant magnetic bias field of $H_B$=7.36 Oe. The marked maximum is clearly visible at the mechanical resonant frequency of the ME sensor, and three small secondary maximums at a multiple of the line frequency of 50 Hz.

In FIG. 5, the same magnetic bias field $H_B$=7.36 Oe is applied, likewise $H_{mess0}$=0.125 Oe, only the measurement frequency is reduced here to $f_{mess}$=15 Hz. The ME voltages at 15 Hz and at line frequency are of comparable size in the range around 10 μV; the noise is one order of magnitude below this.

The measuring signal from FIG. 5 is finally detected using the means of the invention, and the result is illustrated in FIG. 6. No magnetic bias field is now present at the sensor. The inventive modulation signal is described by $H_{mod0}$=6.72 Oe and $f_{mod}$=829 Hz and is superimposed on the measuring signal of the sensor. As an example, $H_{mod0}$ is selected to be slightly below the optimum value $H_B$=7.36 Oe. Otherwise the precise value of $H_{mod0}$ is not so important, it just has to be known.

FIG. 6 now shows three maximums of the ME voltage, one of which (at 829 Hz) directly results from the informationless, known modulation signal. During the evaluation, it could be suppressed by known measures. The other two maximums are at 829 Hz-15 Hz=814 Hz and at 829 Hz+15 Hz=844 Hz=$f_R$, the ME voltage of the latter exceeding that of the other maximum by one order of magnitude.

It is not possible, by varying the modulation frequency in a range around 829 Hz, to achieve an ME voltage that at 844 Hz assumes a value of equal size or a greater value than the one that is shown. It is only in the area of 859 Hz, that this is again possible. By wobbling of $f_{mod}$ across a frequency range below or above $f_R$, complementary frequency ranges, the resonance case of the sensor and thus also the value of $f_{mess}$ is unambiguously identified in the superimposed magnetic field.

In the example of FIG. 6, the resonance component of the measurable ME voltage is about 13.3 mV, that is to say three orders of magnitudes above the measurement value $U_{ME}$ of the same measuring signal in the example of FIG. 5 that represents the measurement according to the prior art. If $U_{ME}$ is converted for example using a calibration curve into the magnetic field amplitude $H_{sup}$, this results in $H_{mess0}$=$H_{sup}$/$H_{mod0}$ and the measurement task is fulfilled.

The direct advantage provided by the inventive method consists in a considerably enlarged signal/noise ratio and the possibility to dispense with a constant bias field. In addition, the ME sensor can be provided with any mechanical resonant frequency that has to be determined only once.

The invention described so far encounters problems when the detection of lower-frequency measuring signals, $f_{mess} \approx$ a few Hertz, is involved. In this case, a frequency $f_{mod} \approx f_R$ would have to be provided for the modulation signal with the consequence that the informationless modulation signal would supply the largest contribution to the sensor voltage.

In fact $f_{mod}$ should always have a certain distance relative to $f_R$. The resonance curve $U_{ME}$ (H) with H=H (f), see FIG. 2, shows a Lorentz curve with respect to the frequency at which the magnetic field H can be varied at a constant amplitude. If $\Delta f>0$ designates the half width of this curve, at least $$|f_{mod}-f_R|>\Delta f \qquad (8)$$

should be guaranteed. Thus measuring signals with $|f_{mess}|<\Delta f$ are at first inaccessible.

Luckily, in this situation it is possible to revert to the concept of a bias field and to select another operating point of the ME sensor. Here the bias field strength should be set such that a higher order than the square one dominates the course of the magnetostriction characteristic in the operating point, designated here as $H_W$, that is to say for example $$\lambda(H=H_W) \approx c_1(H_W+dH)+c_2(H_W+dH)^2+c_3(H_W+dH)^3 \qquad (9)$$

with $c_1$, $c_2 \ll c_3$ and dH being the time-variant magnetic-field component. If here, too, the variable magnetic field that is to be measured is superimposed with the modulation field on the ME sensor, then selecting $f_{mod}$ provides the possibility to match one of the resulting mixing frequencies (2 $f_{mess}+f_{mod}$), (2 $f_{mess}-f_{mod}$), ($f_{mess}+2 f_{mod}$) or ($f_{mess}-2 f_{mod}$) to the sensor resonant frequency. In particular measuring signals in the range $\Delta f/2<|f_{mess}|<\Delta f$ can be detected while complying with equation (8). If this is not enough for the user, he can then still search for another operating point $H_W$ having a higher leading order of $\lambda(H)$. It is to be expected that he will find such operating points only for $H_W>H_B$—that is to say beyond the inflection point.

The discussion above relates to the use of a magnetic bias field in conjunction with the inventive frequency conversion into the sensor resonance if and only if low-frequency measuring signals are to be detected that are smaller than the half width of the sensor resonance curve. In all other measurement applications—and these are the conventional ones—a magnetic bias field can now be totally dispensed with.

This already simplifies the manufacture of an ME sensor array considerably, in particular in microsystem technology, e.g. as a chip. In addition, no particular demands are placed on the resonant frequencies of the individual ME sensors in the array. If it is desired to carry out spatially resolved measurements using the array, it would of course be favorable if all sensors would show the same resonance behavior and could simultaneously be excited by the modulation field. Even if there are differences between the sensors due to the manufacture, they become irrelevant during wobbling of the modulation field, or can be identified during the evaluation and thus compensated, if the resonant frequencies can all be achieved by the selected wobble band width.

Even larger variations in the resonant frequencies in the array—as the US 2010/0015918 A1 mentioned initially probably imagines for data transmission purposes—can make sense if the interest is that only a specific sensor of the array is to detect a signal at a given point in time. For example a magnetic alternating field of defined frequency that carries any information, for example amplitude modulated in the sense of US 2010/0015918 A1, can be guided to a predetermined sensor, here: data channel, by applying the invention described here. A change to a different data channel would then simply take place by changing the modulation frequency, possibly while matching the modulation amplitude.

The method for measuring a magnetic field can preferably take place using an arrangement that exhibits a number N of magnetoelectric sensors, the sensors possessing known mechanical resonant frequencies $f_R(i)$, i=1, . . . , N and the magnetic field possessing a harmonic time dependence with the known frequency $f_M$, the sensor designated by the index i being determined for detecting the magnetic field by superimposing the magnetic field with a modulation magnetic field having the frequency $f_{mod}=f_R(i)+f_M$ or $f_{mod}=f_R(i)-f_M$.

The invention claimed is:

1. A method for measuring a time-variant magnetic field using a magnetoelectric sensor having a mechanical resonant frequency $f_R$, the magnetic field comprising at least one component having a harmonic time dependence
   with the measuring signal amplitude $H_{mess0}$ to be determined and the measuring signal frequency $f_{mess}$ to be determined in a known frequency interval $f_{min}<f_{mess}<f_{max}$, characterized by the following steps:
   a. superimposing the magnetic field with a modulation magnetic field having a harmonic time dependence with the known modulation amplitude $H_{mod0}$ and a selectable modulation frequency on the sensor,
   b. varying (wobbling) the modulation frequency over a complementary frequency interval determined by the known interval limits $f_{min}$, $f_{max}$ and the resonant frequency of the sensor $f_R$,
   c. measuring the sensor signal for each selected modulation frequency,
   d. searching for the at least one modulation frequency $f_{mod}$, which results in a sensor signal in the mechanical resonance of the sensor,
   e. calculating the measuring signal frequency $f_{mess}$ from the previously determined modulation frequency $f_{mod}$ and from the resonant frequency of the sensor $f_R$
   f. translating the sensor signal at the modulation frequency $f_{mod}$ into the superimposed magnetic field amplitude $H_{sup}$,
   g. calculating the measuring signal amplitude $H_{mess0}$ from the superimposed magnetic field amplitude $H_{sup}$ and the modulation amplitude $H_{mod0}$.

2. The method according to claim 1, wherein the operating point of the sensor in its magnetostriction characteristic is established such that its frequency response in the leading order is a square function of the magnetic field strength.

3. The method according to claim 2, wherein the complementary frequency interval is established according to $f_R-f_{max}<f_{mod}<f_R-f_{min}$ or $f_R+f_{min}<f_{mod}<f_R+f_{max}$ and the at least one component of the magnetic field with the harmonic time dependence is calculated according to $f_{mess}=|f_R-f_{mod}|$ and $H_{mess0}=H_{sup}/H_{mod0}$.

4. The method according to claim 1, wherein the magnetic field exhibits a plurality of components having a harmonic time dependence with different magnetic field component amplitudes and/or magnetic field component frequencies in the interval $f_{min}<f_{mess}<f_{max}$ and a plurality of modulation frequencies are determined in a complementary frequency interval that leads the sensor into the mechanic resonance, each determined modulation frequency being assigned precisely one magnetic field component frequency and each magnetic field strength measured in resonance precisely one magnetic field component amplitude.

5. The method according to claim 1, wherein the absolute value of $H_{mod0}$ is set up to be smaller than or equal to the absolute value of a field strength $H_B$, the magnetostriction characteristic of the sensor having its inflection points at the field strength±$H_B$.

6. The method according to claim 1, wherein said method is carried out using a device for measuring a magnetic field having an arrangement comprising a number N of magnetoelectric sensors, the sensors possessing known mechanical resonant frequencies $f_R(i)$, $i=1, \ldots, N$ and the magnetic field having a harmonic time-dependence with the known frequency $f_M$, wherein the sensor designated by the index i is determined for detecting the magnetic field by superimposing the magnetic field with a modulation magnetic field having the frequency of $f_{mod}=f_R(i)+f_M$ or $f_{mod}=f_R(i)-f_M$.

7. A method for measuring a time-variant biologically produced magnetic field having a frequency of from 1 Hz up to approximately 100 Hz using a magnetoelectric sensor having a mechanical resonant frequency $f_R$, the magnetic field comprising at least one component having a harmonic time dependence with the measuring signal amplitude $H_{mess0}$ to be determined and the measuring signal frequency $f_{mess}$ to be determined in a known frequency interval $f_{min}<f_{mess}<f_{max}$, characterized by the following steps:

a. superimposing the magnetic field with a modulation magnetic field having a harmonic time dependence with the known modulation amplitude $H_{mod0}$ and a selectable modulation frequency on the sensor,
b. varying (wobbling) the modulation frequency over a complementary frequency interval determined by the known interval limits $f_{min}$, $f_{max}$ and the resonant frequency of the sensor $f_R$,
c. measuring the sensor signal for each selected modulation frequency,
d. searching for the at least one modulation frequency $f_{mod}$, which results in a sensor signal in the mechanical resonance of the sensor,
e. calculating the measuring signal frequency $f_{mess}$ from the previously determined modulation frequency $f_{mod}$ and from the resonant frequency of the sensor $f_R$
f. translating the sensor signal at the modulation frequency $f_{mod}$ into the superimposed magnetic field amplitude $H_{sup}$,
g. calculating the measuring signal amplitude $H_{mess0}$ from the superimposed magnetic field amplitude $H_{sup}$ and the modulation amplitude $H_{mod0}$.

\* \* \* \* \*